(12) United States Patent
Le Roux (10) Patent No.: US 7,061,241 B2
(45) Date of Patent: Jun. 13, 2006

(54) METHOD AND APPARATUS FOR MR IMAGE ACQUISITION

(75) Inventor: Patrick Le Roux, Palaiseau (FR)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/070,357

(22) Filed: Mar. 2, 2005

(65) Prior Publication Data

US 2006/0017436 A1    Jan. 26, 2006

(30) Foreign Application Priority Data

Jul. 26, 2004    (FR)    ................................... 04 51659

(51) Int. Cl.
*G01V 3/00*    (2006.01)

(52) U.S. Cl. ...................................... 324/309; 324/318

(58) Field of Classification Search ................ 324/307, 324/309, 300, 318, 319, 322; 600/410
See application file for complete search history.

(56) References Cited

U.S. PATENT DOCUMENTS

| | | | | |
|---|---|---|---|---|
| 5,545,990 | A * | 8/1996 | Kiefer et al. ................ | 324/307 |
| 5,615,676 | A * | 4/1997 | Kohno ......................... | 600/410 |
| 5,779,636 | A * | 7/1998 | Kanazawa .................... | 600/410 |
| 6,057,686 | A * | 5/2000 | Van Den Brink et al. .. | 324/309 |
| 2005/0148858 | A1* | 7/2005 | Hargreaves .................. | 600/410 |

FOREIGN PATENT DOCUMENTS

| | | |
|---|---|---|
| DE | 197 20 438 A1 | 11/1998 |
| JP | 2001-14930 A | 6/2001 |

OTHER PUBLICATIONS

Li Tao et al., "Fast T2-Weighted MR Imaging: impact of variation in pulse sequence parameters on image qualtiy and artifacts", Magnetic Resonance Imaging, Sep. 2003, vol. 21, No. 7, pp. 745-753.

Mandry et al. "Evaluation of a multiple TE, black blood Single Shot FSE sequence for T2 mapping of the myocardium", Proc. of the International Society for Mag. Res. in Med., ISRM, 11th Scientific Meeting, Jul. 10, 2003, p. 377.

Marie et al., "Detection and prediction of Acute Heart Transplant Rejection with the Myocardial T2 Determination Provided by a Black-Blood Magnetic Resonance Imaging Sequence", J. Amer. College of Cardiology, vol. 27, No. 3, 2001, pp. 825-831.

(Continued)

*Primary Examiner*—Brij B. Shrivastav
(74) *Attorney, Agent, or Firm*—Cantor Colburn LLP (57) ABSTRACT

An NMR image of a patient's heart uses SSFSE (single shot fast spin echo) type pulses to condition the body by a preparation of a phase-encoding gradient pulse whose duration differs from one sequence to another so as to define, from one sequence to another, a different effective echo time. At each sequence an image is displayed representing the discrimination of the contributions of the particles of the body as a function of their time T2 compared with this effective time. For the heart, with a single respiration on the part of the patient, lesions due to infarction and transplant rejection are revealed.

60 Claims, 3 Drawing Sheets

OTHER PUBLICATIONS

Simonetti et al., "Black-Blood T2 Weighted Inversion-recovery MR imaging of the heart", Radiology 199:49-57, 1996.

Le Roux et al., "Optimized Outer Volume Suppression for Single-Shot Fast Spin Echo Cardiac Imaging", JMRI 8:1022-1032, 1998.

Vignaux et al., "Comparison of SSFSE and conventional SE Sequence for MR imaging of the heart: Initial Experience", Radiology 219:545-550, 2001.

Kalifa et al., Evaluation of myocardial effects of growth hormone treatment in children—Study of myocardial T2 relaxation time: RSNA 2002.

* cited by examiner

METHOD AND APPARATUS FOR MR IMAGE ACQUISITION

CROSS-REFERENCE TO RELATED APPLICATIONS

This application claims the benefit of a priority under 35 USC 119(a)–(d) to French Patent Application No. 04 51659 filed Jul. 26, 2004, the entire contents of which are hereby incorporated by reference.

BACKGROUND OF THE INVENTION

An embodiment of the present invention is a method and apparatus for the acquisition of an image by nuclear magnetic resonance (NMR). The acquired image is that of a part of an object, such as body, subjected to an intense magnetic field known as an orienting field during a nuclear magnetic resonance procedure. This type of procedure is meeting with growing success in the field of medicine where the images produced serve as a diagnostic aid, especially in cardiac diagnostics.

However, the application of the disclosed method and apparatus is not restricted to this field. The method and apparatus can also be implemented, for example, in the field of physical measurements where spectrometers are used or for inanimate and animate objects.

An embodiment of the invention enables the differentiation, in the heart which is an organ in constant movement, of signs of infarction or, in the context of heart transplants, of signs of rejection, especially well before such rejection become pathological.

In nuclear magnetic resonance imaging, to obtain an image of a slice of an object to be examined, the object in question, and especially the part in which the slice is located, is subjected to a constant, intense and uniform magnetic field B0. Under the effect of this field B0, the magnetic moments of the particles of the body are oriented within a few instants (within a few seconds), in the direction of the magnetic field: hence the name "orienting field" given to this field. If the magnetic moments of the particles of the object are then excited with an RF magnetic excitation oscillating at an appropriate frequency, this causes the orientation of the excited magnetic moments to flip. At the end of the excitation, the magnetic moments tend to get realigned with the orienting field in a natural precession motion known as a free precession motion. During this precession motion, the particles radiate and an electromagnetic de-excitation energy that can be measured. The frequency of the de-excitation signal, also known as NMR, is characteristic of the excited particles (in medicine, this is the hydrogen atom contained in the molecules of water or fat or other compounds spread throughout the human body) and of the strength of the orienting field. The characteristics of the object can be deduced from the processing of the measured signal.

The processing of the measured signal to extract an image is complicated by the fact that all the particles of the object, throughout the excited region, re-emit a de-excitation signal at the end of the excitation. It is therefore important to distinguish the contributions, in the total NMR signal, of all the elementary regions (known as voxels) of the excited volume to reconstruct their distribution, and ultimately to prepare the image. This discrimination is possible only by carrying out a series of excitation-measurement sequences during each of which an encoding is done, differently from one excitation or one sequence to another, of the NMR signals to be measured. If the encoding applied is known, then there are known ways of using pure imaging techniques, especially of the 2DFT type, to rebuild the image.

The measurement of the NMR signal relates to the amplitude of this signal. Given a demodulation frequency around which the NMR signal is demodulated, all that can be hoped for as a result of the measurement is a measurement of the density, in the structures being examined, of the specific particles (e.g., hydrogen) for which only one of the resonance frequencies is then studied. Broadly speaking, at the end of a given duration of the excitation, the higher this density, the stronger is the NMR signal.

The relaxation, or damping, of the NMR signal is data used to obtain information on the object being studied. This damping is a complex damping: it represents an interaction known as a spin-lattice interaction of the particles (e.g., the proton of the hydrogen atom) excited with the surrounding matter and an interaction known as the spin-spin interaction between the protons.

In a known modeling of the physical phenomena that come into play, it has been determined that the spin-lattice relaxation time, also called the time T1, corresponds to the time constant of an exponential growing or growth (a reorientation) of the component, aligned with the orienting field (or longitudinal with it), of the total magnetic moment at the concerned place in the object. The spin-spin relaxation time, called T2, also corresponds to a time constant, in this case the time corresponding to an exponential decay of the transversal component (orthogonal to the longitudinal component) of these magnetic moments.

In one example that shall be described further below in the context of the description of an embodiment of the invention, reference shall be made to a time T1 of about 750 ms and especially a time T2 of about 30 ms to 100 ms: the concerned regions of the object will then be chiefly those of the heart. The distinction between the regions of the object subjected to lesions and the healthy regions is revealed by T2 images.

It is possible, during a series of procedures of different types, to make one relaxation phenomenon appear by preference over the other. It is then said that T1 or T2 images have been made as the case may be. The essential parameter of NMR experiments that is generally brought into play is then the repetition time TR that punctuates the periodicity of the excitation pulses in the sequences of the series of imaging sequences implemented.

To make a T2, image, it is desirable await a total growth of the magnetization (of its longitudinal component): between each sequence, it is desirable to wait for a duration of about three to four times the duration of T1. At the end of this duration, leaving aside the concentration of the particles (which is overlooked), it can be said that the first NMR signal measured is dependent only on the relaxation time T2. It is only if the repetition rate is far too rapid that the influence of the decay in T2 of the NMR gets eliminated before the size of the differentiation of the growth in T1. One of the difficulties of T2 images appears immediately at this stage of the explanation: it is that they are long. In practice, they are about three or four times longer than the T1 images. For example, for a T2 image of the heart, a patient has to be undergo the experiment in a motionless state (holding his breath in particular) for successive periods of time which could add up to a total of about 16 minutes. Although certain patients are fairly cooperative, the NMR procedure that is harmless as it happens, then becomes very painful, especially as patients are generally feeble persons.

A prior art method of overcoming the drawbacks mentioned proposes a fast T2 image which, in one example, may last up to three or four minutes while avoiding the disturbing effects of the contrast in T1 in this image. The goal to be attained is that the acquisition period should not be too lengthy, both for the patient and for the cost effectiveness of the apparatus. This duration in any case is far too lengthy for cardiac examination.

Fast image acquisition methods known as methods of the fast spin echo or FSE type have been proposed. In practice, we can distinguish sequences known as pure FSE sequences with, typically, 16 echoes and 16 acquisitions repeated every four seconds. This leads to 64 seconds of acquisition for one slice. Other methods, known as single shot FSE (SSFSE) type methods are described here below. In these SSFSE methods, the sequences used comprise an excitation of the magnetic moments of the protons, known as flip. This excitation gives rise to a major flip in magnetization, typically equal to 90°, followed by a large number of spin echo excitation pulses (at 180°), known as refocusing pulses, very close to one another and typically separated from one another by a period of about a few milliseconds. To simplify the explanation, one example will take a duration of 5 ms between each echo and the next. But naturally the embodiment of the invention can be applied to cases where the echo time is smaller or greater.

Furthermore, between each of these refocusing pulses and the next, and before the read operation, phase-encoding gradients are applied. These gradients vary in successive steps from one echo to another. The gradient pulses thus applied are furthermore compensated for in a following gradient pulse, before the next refocusing pulse. As regards the slice selection gradient pulses, the fact of centering them in time on the central date of the refocusing pulse causes them to be automatically compensated for. It can be shown that this is also the case with read gradient pulses.

Typically, it is possible in this way, in a single sequence of decay of the T2 signal (for example in a period of about 400 ms), to acquire 128 echoes. By thus applying read gradients during the reading, it is possible, at the end of a single sequence, to acquire an entire image in a very short period of time, in the range of T2 or a multiple of some T2 periods. Typically, each refocusing pulse may last 5 ms (to be very selective), or 2.4 ms in being less selective. In an embodiment of the invention, it is rather the latter duration that will be chosen, even though, for the useful 90° excitation, a lengthier duration could be envisaged. The measurement of the NMR signal at the time of each echo, in taking 256 samples every 8 microseconds, last about 2 ms.

The phase encoding sequences comprises encoding pulses whose value evolves in steps, from a negative value to a positive value. The negative or positive character is only a matter of convention. It has no meaning except to the extent that it enables the distinguishing of field gradients oriented along an axis, in one sense or another on the axis.

As is known, the effective echo time is the time between the application of the first excitation pulse, in practice the 90° pulse that creates the measurable SSFSE signal, and the time at which the phase-encoding gradient undergoes a reversal of polarity.

With the above prior art solution, we would be led to making images whose resolution would depend on the effective echo time. In the prior art, for an effective echo time of 100 ms, with an echo time between spin echo pulses equal to 5 ms, 20 encodings could be made before reversal, and 20 after, giving an image on 40 lines. This is acceptable. However, for an effective echo time of 30 ms, under the same conditions, there would be no more than 12 image lines, and this is insufficient.

Furthermore, firstly the programming of such an experiment would be fairly complex owing to the fact that, from one sequence to another, many parameters would be changed. Secondly, the growth of the magnetization, at the end of the time T1 is not fully controlled since, from one sequence to another, the duration of the sequences would be different.

It will also be noted that the duration of the sequences is limited by the absorption of energy in the patient. It must be considered in the case of multi-slice image acquisition (for which the duration of acquisition is proportional to the number of slices). The number of acquisitions thus soon becomes a problem if each acquisition lasts too long.

BRIEF DESCRIPTION OF THE INVENTION

The problems to be resolved by an embodiment of the invention are twofold. Firstly, for the heart, the duration of 400 ms is lengthy as the heart moves far too much during this period. Furthermore, the fact remains that the T2 differentiation is not obtained. In the context of SSFSE type pulses, an effective echo time Teff is shown. This effective echo time makes it possible to clearly distinguish particles whose time T2 is smaller than Teff from particles whose time T2 is greater than Teff. In practice, it is known that the signal shown has an amplitude of the $\exp(-\text{Teff}/T2)$ type. The question therefore is to renew the experiments, with certain number of different Teff values, especially around values ranging from 30 ms to 100 ms.

In an embodiment of the invention, differentiating the number of phase-encoding pulses when the gradient is oriented in one sense, chosen to be negative by convention, from the number of phase encoding impulses when the gradient is oriented in the other sense, which is positive by convention. This gives rise, in the negative sense, to a short preparatory sequence so to speak, with a duration of varying length that correspondingly defines an effective echo time of varying length. In practice, this preparatory sequence lasts 30 ms to 90 ms as the case may be. After this preparatory sequence, in the same operation, a larger number of phase encodings are made. These are equal to the number of lines desired in the image. This overcomes the constraint of effective resolution depending on the effective time chosen.

Furthermore, in an embodiment of the invention, to prevent the growing of magnetization as function of T1 from being different, from an image with one given effective time to another image with another effective time, it is ensured that all the sequences have an equal number of phase encodings and spin echo pulses. Simply, the sequences with short effective times are supplemented, at the end of the sequence, by pulses that are unnecessary at the level of the image but are useful to condition the part of the object being studied in the same conditions at each time.

In an embodiment of the invention, the resolution of the image is given by the number of echoes that are read after the Teff, multiplied by two. To be able to make this multiplication by two, it is desirable to take plus (or minus) a certain number of lines before the Teff, for example six. Thus, with a Teff of 30 ms, it is possible to place six lines (6×5 ms). For example, to acquire an image of 64 reconstructed lines, 32 echoes will be measured, hence 32×5 ms=160 ms after the 30 ms, giving a total of 190 ms. When it is sought to have a Teff of 100 ms, there will simply be a wait in acquiring empty echoes. Then, the six lines before the flip plus the 32 lines will be taken into consideration. The experimentation will be finished in 100 ms+160 ms=260 ms. In an embodiment of the invention, in the acquisition with 30 ms of Teff, subsequent empty acquisitions (for 70 ms in this example) will be added to give the same total duration at the end.

An embodiment of the invention therefore is a method and apparatus for the acquisition of an image by nuclear magnetic resonance wherein an object to be imaged is subjected to a constant, intense and uniform magnetic field and a part of the object is excited by a series of sequences of P electromagnetic RF excitations in the presence of field gradient pulses and a progressive variation is effected, during a first sequence, of the value of a pulse of a phase-encoding gradient by a given step value between a negative value equal to n times this step value and a positive value equal to N times this step value and during another sequence following this first sequence, the negative value of a pulse of the phase-encoding gradient is made to vary n+m times by the same given step value and electromagnetic signals are acquired usefully only in response to the n last negative pulses and the N positive pulses of the phase-encoding gradient.

BRIEF DESCRIPTION OF THE DRAWINGS

An embodiment of the present invention will be understood more clearly from the following description and the accompanying figures. These figures are given purely by way of an indication and in no way restrict the scope of the invention. Of these figures.

DETAILED DESCRIPTION OF THE INVENTION

Figure 1:
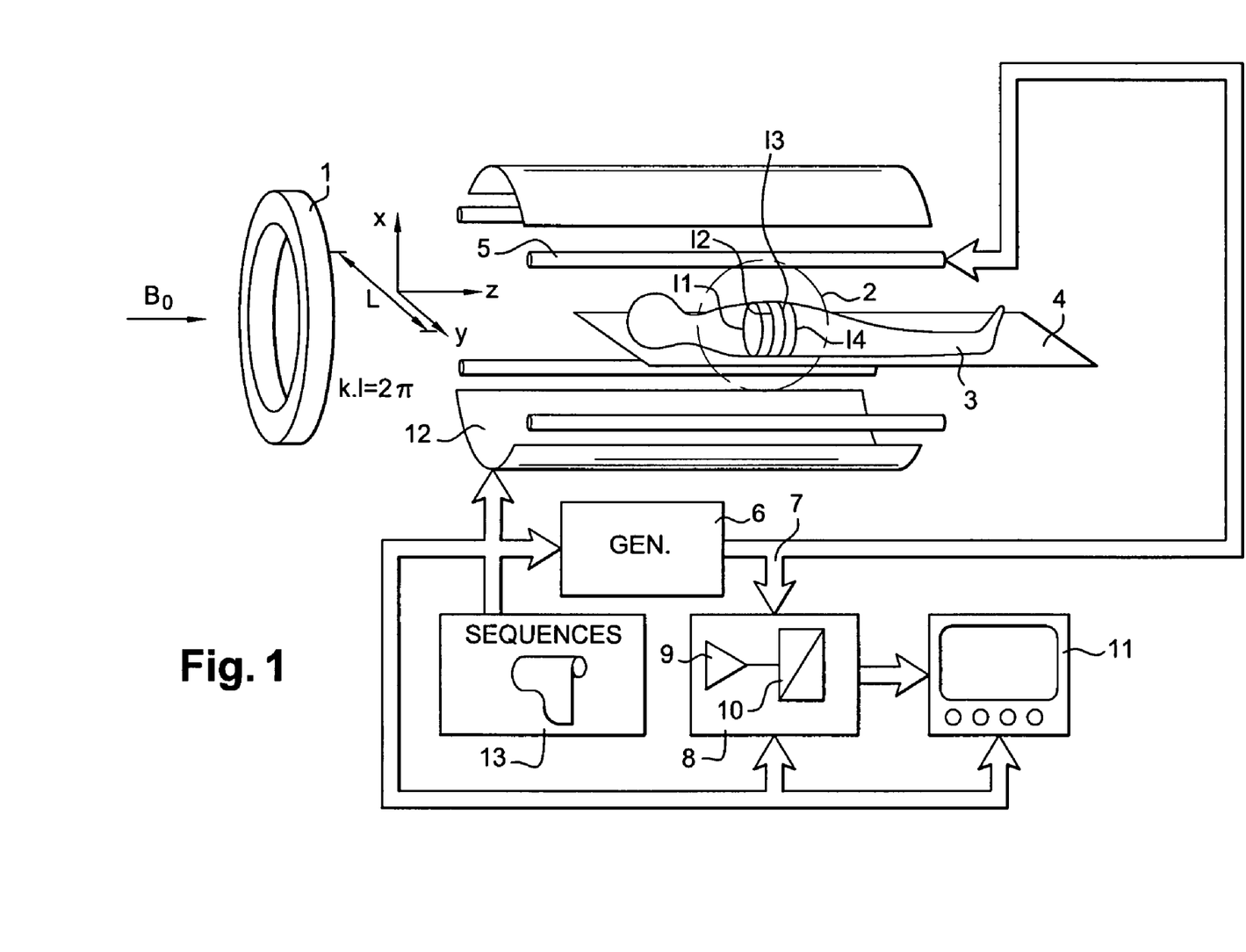
FIG. 1 is a schematic view of an NMR apparatus that can be used to implement an embodiment of the method of the invention.

FIG. 1 shows an NMR apparatus that can be used to implement an embodiment of the method according to the invention. Generally speaking, this apparatus comprises means 1 for producing a constant, intense and uniform magnetic field B0 in a region of examination 2. An object 3, such as a body, is supported for example by a table 4 is brought close to the region 2. Throughout the procedure, the body 3 remains subjected to the magnetic field B0. The part 2 of the object 3 subjected to the examination is more particularly the region of the heart of the patient 3. Means for excitation and sensing, for example, an antenna 5 connected to a generator 6, is used to prompt the excitation of the magnetic moments of the particles of the body 3 located in the zone 2. In one example, the antenna 5 is a bar antenna capable of producing a rotating excitation field by a phase-shifted excitation of each of the bars.

The excitations are temporary. At the end of these excitations, the antenna 5 may serve to pick up the de-excitation signal in order to conduct it, through a duplexer 7, to means 8 for reception. Means 8 classically comprises detection, amplification and demodulation circuits 9 and processing circuits 10. The processing may include the shaping of the signal in order to represent it in a means for display, such as device 11. It is then possible to make the image of one or more slices 11, 12, 13, or 14 of the body 3 appear on the screen of the display device 11. The description of an embodiment of the invention will be restricted to a compromise of four slices, but of course the number of slices could be greater or smaller.

A procedure designed to obtain an image may comprise a multitude of excitation-measurement sequences during each of which means 12 for applying a gradient filed, such as coils, are used to apply encodings to the free precession signal of the magnetic moments. These encodings as well as the working of the generator 6, the duplexer 7 and the reception means 8 and display means 11 are governed by a means 13 for sequencing. A program of the sequencer 13 organizes the actions. All these units are known per se. In particular, the sequencer 13 has the property of programmability of its sequences. Thus, the characteristics of each of the operations to be performed in the sequences can be modified quite simply in the program to change the nature of the experiment undertaken.

Figure 2A:
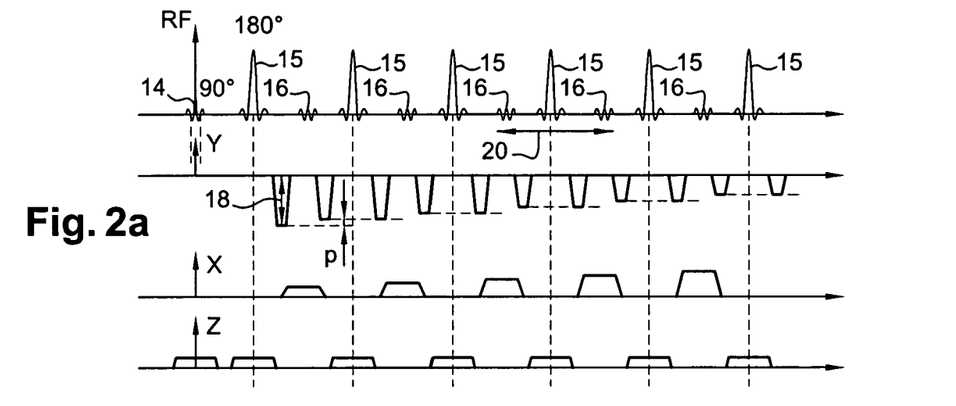
FIGS. 2a to 2c are graphs showing phase-encoding forms of an embodiment of the invention.

FIG. 2a shows the timing diagram of the different signals applied and read in the apparatus. The first line of FIG. 2a shows a first excitation pulse 14 at 90°, followed by a regular string of refocusing pulses 15 at 180°. The pulse 14 is the one that creates the useful flip of the magnetization for the sequence. The other pulses serve only to prompt the reversal of the phase dispersion due to the non-homogeneities of the field B0. After each pulse 15, the free precession signal reappears in the form of oscillations 16 which are measured and for which the image is deduced.

The second line of FIG. 2a shows the phase encoding impulses along the axis Y. The third line shows the read encoding along the axis X. The fourth line shows the slice selection encodings along the axis Z. These axes X, Y, Z are also shown conventionally in FIG. 1. These designations could furthermore be permutated. The slice selection encoding applied during the pulses 14 and 15 is automatically compensated for. The read gradient applied to the axis X is automatically compensated for owing to the fact that it is present on either side of the refocusing pulses 15, for the duration of the reading of the oscillations 16. While the selection gradient is always the same, the frequency of the NMR signal, both excitation and measurement, to select different slices referenced 11, 12, 13 or 14 is modified.

With respect to the phase encoding applied here to the axis Y, line 2, the present description is not been concerned with showing how the known compensation occurred. Rather, it has been sought, above all, to show how the phase-encoding pulses have evolved.

Figure 2B:
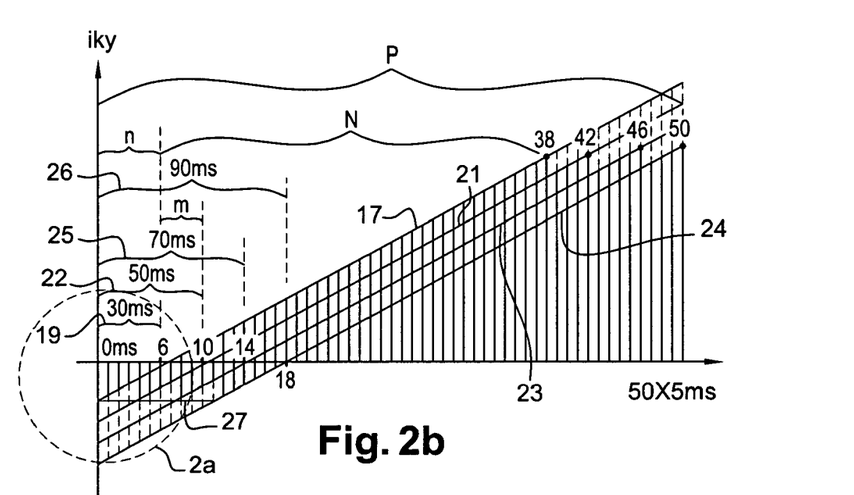

According to an embodiment of the invention, a shown in FIG. 2b, during a first sequence 17, the value 18 (FIG. 2a) of a pulse of the phase-encoding gradient is made to vary progressively with a given step value. This step value is shown in FIG. 2a in which, from a compensated (double) phase-encoding pulse, for an excitation pulse 15, to another compensated phase-encoding pulse, for a following excitation pulse 15, the amplitude of the phase-encoding pulse varies by a step value p represented by dashes. Thus, immediately, the phase-encoding pulses vary proportionately from the most negative to the most positive. This value 18 evolves between a negative value equal to n times the value of this step and a positive value equal to N times the value of this step. In the example shown, n is equal to 6 and N is equal to 32. This mode of action determines an effective echo time 19. The duration of the time 19 is 30 ms if the spin echo time 20 between the application dates of two successive spin echo pulses 15 is equal to 5 ms. It may be noted that this spin echo time 20 is also the time between the dates of acquisition of the midpoints of the oscillations 16.

The representation of FIG. 2a for the gradient Y is a diagrammatic view. In reality, the re-phasing gradient pulses compensate for each other in sets of two within a same echo and, if the first is positive, the next one is negative. There is no link in principle between the encoding lobes Y on either side of a refocusing excitation (at 180°) except of course that in general the amplitudes increase linearly. Therefore, the above explanation remains valid.

In an embodiment of the invention and by way of example, n is smaller than N, but this is not obligatory. In practice (FIG. 3), the acquisition of the image should comprise an equal number of phase encodings before the reversal of polarity and after the reversal of polarity. In one example, 32 encodings each time, giving a total of 64 encoding are referred to. It is known that these 64 encodings would correspond to a 64-line resolution of the image. In an embodiment of the invention, based on the fact that the object being examined, the heart, is a real object, it is deemed unnecessary to make acquisitions for the negative phase-encoding values. Ultimately, it is possible to be satisfied with 16 measured oscillations corresponding only to the 32 useful phase encodings. To periodize the computation of the Fourier transform and the reconstruction, it is also desirable to acquire the measured oscillations 16 present during the first phase encodings (in this case 6).

Figure 3:
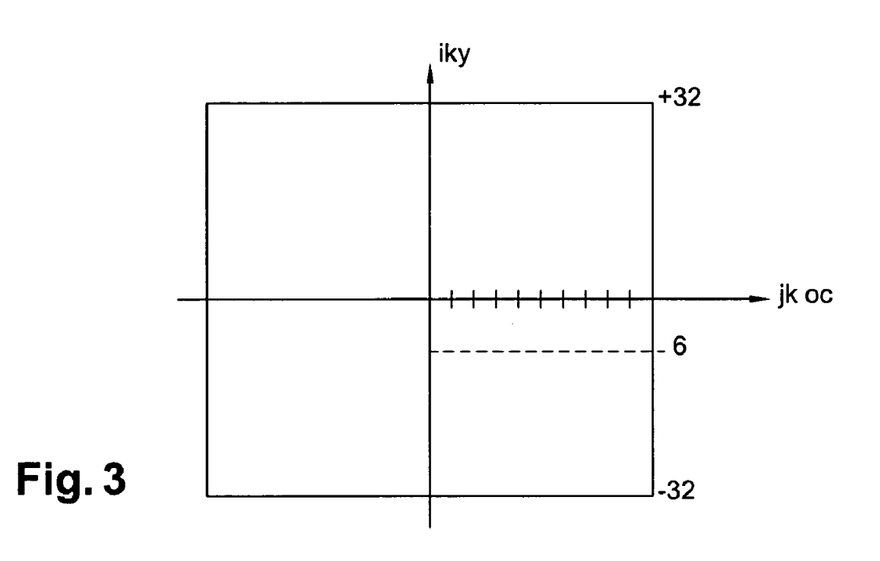
FIG. 3 is a diagrammatic view of an image required according to an embodiment of the method of the invention.

The number of columns in the image of FIG. 3, the horizontal resolution, depends on the discrimination of processing with the read gradient during the read phases. In one example, it is possible to choose 64 steps of discrimination so as to obtain an image of 64×64 pixels. If desirable, the horizontal resolution can be increased in order to obtain a 64×128 image or even a 64×256 image.

During a following sequence 21 that follows the sequence 17 (FIG. 2b) the negative value 18 of the gradient pulse is made to vary progressively once again. However, in this case, the number of preliminary phase-encoding gradient pulses will be increased from n to n+m. In the example, there is thus a passage from 6 to 10 preliminary pulses, m being equal to 4, before the reversal of polarity of the phase-encoding gradient pulse. This mode of action makes it possible to now determine an effective echo time equal to n+m times the spin echo, time, i.e., in this example, 50 ms. The sequence 21 will of course be launched while the slice selection on the axis Z will be the same as for the sequence 17. Naturally, the sequence 21 is launched only when the sequence 17 is finished.

Continuing in this way, other sequences are determined, respectively 23 and 24, for which the effective echo times 25 and 26 are greater than the effective echo times 19 and 22, for example in this case 70 ms and 90 ms typically.

Since, each time, only n+N useful phase encoding pulses are chosen, these pulses occur respectively according to the sequences 17, 21, 23 and 24 between the pulses placed on the positions 0 and 38, 4 and 42, 8 and 46, and 12 and 50. The term "useful phase encoding pulse" designates those pulses for which the measured resonance signal 16 is truly processed. If need be, the unnecessary signals 16 are either not detected or not processed, at least not in totality.

At the practical level, to simplify the programming, it is noted that for the sequences 21, 23 and 24, the phase-encoding gradient maintains a monotonic progression. However, given the fact that, for the periodization of the computation, only the 6 first pulses are really needed, it could even be accepted that the phase encoding preliminary to the useful pulses 6 is not growing but constant. This constancy is symbolized by the peak envelope 27 of maximum values of the negative pulses. In practice, given the programming proposed by the sequencer 13, it is preferred to make the phase-encoding pulses vary, during the sequences 21, 23 and 24, by a negative value equal to n+m times the value of the phase-encoding step.

This action makes it possible to propose four images, those corresponding to the progression 17, 21, 23 and 24, acquired while the effective time is different. Ultimately, the healthy tissues, which have a resonance assigned a time T2 of one type, are quite different from the tissues of the regions affected by lesions, and assigned an echo time of another type. In these conditions, the corresponding images will be quite different and the comparison of the images 17, 21, 23 and 24, or even their subtraction, will reveal these lesions clearly when the case arises.

Figure 2C:
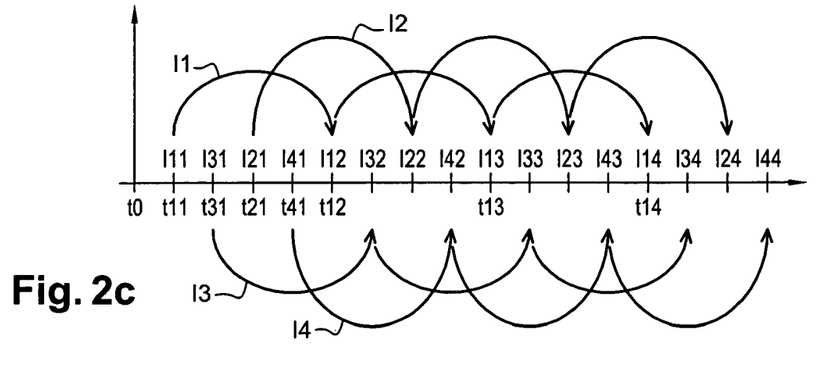

The problem of control over the time T1 will now be described. In practice, the practitioner will not be satisfied with only one image in only one slice taken at different effective time values, but will wish to have several images available corresponding to several slices. Here, four of them in the patient's heart have been shown. In FIG. 1, the slices 11 to 14 are preferably adjoining and contiguous. Given what has been evoked previously, in an embodiment of the invention, the excitations of the different slices are interlaced so as to enable the growth of the magnetization along TI. Thus (FIG. 2c) the acquisition corresponding to the progression 17 will be acquired for the slice at the first time t11. This acquisition lasts about 200 ms (38×5 ms=190 ms). At the end of this period, the growth of the magnetization according to TI has not yet been accomplished. It is necessary to wait. This is why, rather than immediately launching the acquisition corresponding to the progression 21, a preliminary acquisition is made in each of the other slices I2, I3 or I4 of the object 3.

Figure 4:
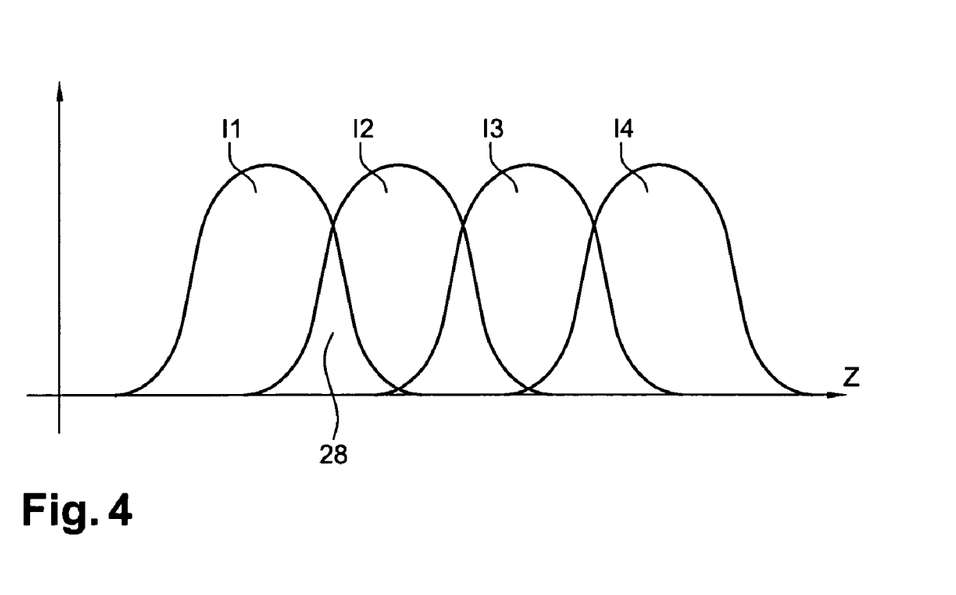
FIG. 4 is a diagrammatic view of the interpenetration of the slices selected in a body of the patient.

As can be seen in FIG. 4, since the excitation pulses 14 or 15 are not very selective, they do not determine well-identified slices I1, I2, I3, I4, in the object 3. On the contrary, these slices interpenetrate. The result of this is that certain lateral parts of the slices, especially the part 28 of the slice I1, also belong to the lateral part of the slice I2, but on another side. If, immediately after the selection of the slice 11, a consecutive selection is made of the slice 12, the part 28 will contribute poorly to the NMR signal because its longitudinal magnetization will have not grown properly in T1. This is why, after an acquisition in the slice I1, for example for the progression 17, it is desirable to excite the slice I3 at the time t31, and then the slice 12 at the time t21, and then the slice 14 at the time t41, before again re-exciting the slice I1 at the time t12, this time with a progression 21 of the phase-encoding gradient. Continuing in this way, for each of the progressions 17, 21, 23 and 24, the slices I1, I3, I2, I4 will be selected successively in that order.

In practice, since the heart is a moving organ, an image will be acquired for a given state of the heart. Since the analysis is not a functional analysis, only one state of the heart is sufficient. Under these conditions, the time t11 is a time fixed relative to a near date t0, corresponding to a synchronization of the heart. Thereafter, the other times t31, t21, t41, t12, t13, t14, etc. too is synchronized in relation to the equivalent of the time t0 closest to it. To simplify the explanation, assuming that the patient's heart is beating at a regular pace of 60 beats per minute, with a period of one second, each acquisition 17, 21, 23 or 24, for each of the slices lasts one second (in practice, more than 200 ms after the time t0 of the heartbeat). Under these conditions, for the study of four effective times and four slices, there are 16 images to be prepared and the duration of the experiment is 16 seconds. It is noted that, with this mode of action, to be able to compare the images usefully with one another, it is possible to ask the patient to refrain from breathing and to hold his breath, in the inhaling or exhaling position as the case may be, for a relatively short period of 16 seconds. It will be noted that this mode of action will make the examination very short and the patient will not be asked to hold his breath again.

In a variant embodiment of the invention, it is desirable for the acquisition of each image that the patient's body should be conditioned in the same way for each image. Thus, preferably, before the activation of the first acquisition 17, it is possible to launch several identical acquisitions 17 before the first one for which the patient has been asked to hold his breath: for example about six acquisitions.

At the same time, an examination of FIG. 2b shows that the first progression would stop at the end of 38 spin echo pulses, the second at the end of 42 pulses, the third at the end of 46 pulses and the fourth at the end of 50 pulses. The result of this would be that, for the following images, the object 3 would be gradually conditioned in a different way. In an embodiment of the invention, all the sequences, whatever the progression concerned, will comprise a same number P of pulses. Here, in the example shown, P is equal to 50. In this case, after the progression 17, an embodiment of the invention undertakes 12 additional pulses. These 12 additional pulses are unnecessary at the level of the image but necessary at the level of the homogeneity of the reconfiguration of the object 3 at the end of the sequence 17. At the end of the sequence 21, instead of adding P−N−n pulses, it is P−n−N−m pulses, in practice 8 pulses that will be added. Continuing in this way, for the progressions 23, four pulses are added, and for the progressions 24, zero pulses are added. By this mode of action, it is ensured that the duration of the sequences is unchanged. Since each sequence is activated at a time t0, which is always the same relative to the heart cycle, and provided that the heartbeat is stable for 16 seconds, the images are considerably improved.

One skilled in the art may make or propose modifications to the structure and/or way and/or function and/or result and/or steps of the disclosed embodiments and equivalents thereof without departing from the scope and extant of the invention.

What is claimed is:

1. A method for acquiring an image by magnetic resonance comprising:
    subjecting an object to be imaged to a constant and uniform magnetic field;
    exciting a part of the object by a series of sequences of P electromagnetic RF excitations in the presence of field gradient pulses;
    effecting a progressive variation, during a first sequence, of the value of a pulse of a phase-encoding gradient by a given step value between a negative value equal to n times this step value and a positive value equal to N times this step value;
    during another sequence following the first sequence, the negative value of a pulse of the phase-encoding gradient is made to vary n+m times by the same given step value; and
    acquiring a signal usefully only in response to the n last negative pulses and the N positive pulses of the phase-encoding gradient.

2. The method according to claim 1 wherein
    after the n+N electromagnetic signals acquired in each sequence, a number of positive pulses of the phase-encoding gradient equal to P−(n+m+N) is applied.

3. The method according to claim 1 wherein
    a first series of sequences is performed in correspondence with a selection of a first slice in the part of the object to be imaged;
    a second series of sequences is performed in correspondence with a selection of a second slice in the part of the object to be imaged; and
    the sequences of the first series being made interlaced with the sequences of the second series.

4. The method according to claim 2 wherein
    a first series of sequences is performed in correspondence with a selection of a first slice in the part of the object to be imaged;
    a second series of sequences is performed in correspondence with a selection of a second slice in the part of the object to be imaged; and
    the sequences of the first series being made interlaced with the sequences of the second series.

5. The method according to claim 3 wherein
    four series of sequences are acquired in correspondence with selections of four slices in the part of the object to be imaged, that are preferably contiguous; and
    the sequences of all the series being made in a state of mutual interlacing.

6. The method according to claim 4 wherein
    four series of sequences are acquired in correspondence with selections of four slices in the part of the object to be imaged, that are preferably contiguous; and
    the sequences of all the series being made in a state of mutual interlacing.

7. The method according to claim 1 wherein
    the durations of the n+m echoes correspond to different values of an effective echo time corresponding to the spin-spin relaxation constant of atoms of the object to be imaged; and
    from one sequence to another, the durations of the n+m echoes develop from a low value to a high value of this echo time or vice versa.

8. The method according to claim 2 wherein
    the durations of the n+m echoes correspond to different values of an effective echo time corresponding to the spin-spin relaxation constant of atoms of the object to be imaged; and
    from one sequence to another, the durations of the n+m echoes develop from a low value to a high value of this echo time or vice versa.

9. The method according to claim 3 wherein
    the durations of the n+m echoes correspond to different values of an effective echo time corresponding to the spin-spin relaxation constant of atoms of the object to be imaged; and
    from one sequence to another, the durations of the n+m echoes develop from a low value to a high value of this echo time or vice versa.

10. The method according to claim 4 wherein
    the durations of the n+m echoes correspond to different values of an effective echo time corresponding to the spin-spin relaxation constant of atoms of the object to be imaged; and
    from one sequence to another, the durations of the n+m echoes develop from a low value to a high value of this echo time or vice versa.

11. The method according to claim 5 wherein
    the durations of the n+m echoes correspond to different values of an effective echo time corresponding to the spin-spin relaxation constant of atoms of the object to be imaged; and from one sequence to another, the durations of the n+m echoes develop from a low value to a high value of this echo time or vice versa.

12. The method according to claim 6 wherein
the durations of the n+m echoes correspond to different values of an effective echo time corresponding to the spin-spin relaxation constant of atoms of the object to be imaged; and
from one sequence to another, the durations of the n+m echoes develop from a low value to a high value of this echo time or vice versa.

13. The method according to claim 7 wherein
the low value is equal to about 30 milliseconds and the high value is equal to about 90 milliseconds.

14. The method according to claim 8 wherein
the low value is equal to about 30 milliseconds and the high value is equal to about 90 milliseconds.

15. The method according to claim 9 wherein
the low value is equal to about 30 milliseconds and the high value is equal to about 90 milliseconds.

16. The method according to claim 10 wherein
the low value is equal to about 30 milliseconds and the high value is equal to about 90 milliseconds.

17. The method according to claim 11 wherein
the low value is equal to about 30 milliseconds and the high value is equal to about 90 milliseconds.

18. The method according to claim 12 wherein
the low value is equal to about 30 milliseconds and the high value is equal to about 90 milliseconds.

19. The method according to claim 1 wherein
the sequences are performed during a same holding of the breath of a patient whose body is being examined.

20. The method according to claim 2 wherein
the sequences are performed during a same holding of the breath of a patient whose body is being examined.

21. The method according to claim 3 wherein
the sequences are performed during a same holding of the breath of a patient whose body is being examined.

22. The method according to claim 5 wherein
the sequences are performed during a same holding of the breath of a patient whose body is being examined.

23. The method according to claim 7 wherein
the sequences are performed during a same holding of the breath of a patient whose body is being examined.

24. The method according to claim 13 wherein
the sequences are performed during a same holding of the breath of a patient whose body is being examined.

25. The method according to claim 1 wherein
the part of the object examined is a patient's heart;
the sequences are all synchronized with a heartbeat of the patient; and
the patient is brought to hold his breath for the totalized duration of all the sequences of the series of sequences.

26. The method according to claim 2 wherein
the part of the object examined is a patient's heart;
the sequences are all synchronized with a heartbeat of the patient; and
the patient is brought to hold his breath for the totalized duration of all the sequences of the series of sequences.

27. The method according to claim 3 wherein
the part of the object examined is a patient's heart;
the sequences are all synchronized with a heartbeat of the patient; and
the patient is brought to hold his breath for the totalized duration of all the sequences of the series of sequences.

28. The method according to claim 5 wherein
the part of the object examined is a patient's heart;
the sequences are all synchronized with a heartbeat of the patient; and
the patient is brought to hold his breath for the totalized duration of all the sequences of the series of sequences.

29. The method according to claim 7 wherein
the part of the object examined is a patient's heart;
the sequences are all synchronized with a heartbeat of the patient; and
the patient is brought to hold his breath for the totalized duration of all the sequences of the series of sequences.

30. The method according to claim 13 wherein
the part of the object examined is a patient's heart;
the sequences are all synchronized with a heartbeat of the patient; and
the patient is brought to hold his breath for the totalized duration of all the sequences of the series of sequences.

31. The method according to claim 19 wherein
the part of the object examined is a patient's heart;
the sequences are all synchronized with a heartbeat of the patient; and
the patient is brought to hold his breath for the totalized duration of all the sequences of the series of sequences.

32. The method according to claim 25 wherein
the holding of the patient's breath is preceded by a set of sequences of P electromagnetic RF excitations.

33. The method according to claim 26 wherein
the holding of the patient's breath is preceded by a set of sequences of P electromagnetic RF excitations.

34. The method according to claim 27 wherein
the holding of the patient's breath is preceded by a set of sequences of P electromagnetic RF excitations.

35. The method according to claim 28 wherein
the holding of the patient's breath is preceded by a set of sequences of P electromagnetic RF excitations.

36. The method according to claim 29 wherein
the holding of the patient's breath is preceded by a set of sequences of P electromagnetic RF excitations.

37. The method according to claim 30 wherein
the holding of the patient's breath is preceded by a set of sequences of P electromagnetic RF excitations.

38. The method according to claim 31 wherein
the holding of the patient's breath is preceded by a set of sequences of P electromagnetic RF excitations.

39. The method according to claim 1 wherein N is greater than n.

40. The method according to claim 2 wherein N is greater than n.

41. The method according to claim 3 wherein N is greater than n.

42. The method according to claim 5 wherein N is greater than n.

43. The method according to claim 7 wherein N is greater than n.

44. The method according to claim 13 wherein N is greater than n.

45. The method according to claim 19 wherein N is greater than n.

46. The method according to claim 25 wherein N is greater than n.

47. The method according to claim 32 wherein N is greater than n.

48. An apparatus for acquiring an image by magnetic resonance comprising:
- means for subjecting an object to be imaged to a constant and uniform magnetic field;
- means for exciting a part of the object by a series of sequences of RF excitations;
- means for applying a series of magnetic field gradient pulses to the object;
- means for effecting a progressive variation, during a first sequence, of a value of a pulse of a phase-encoding gradient by a given step value having a negative value equal to n times this step value; and
- means for effecting a progressive variation, during the first sequence, of a value of a pulse-encoding gradient by a step value having a positive value equal to N times the step value;
- means for varying the negative value of the pulse-encoding gradient during another sequence following the first sequence, n+m times by the same given step value; and
- means for acquiring a signal usefully only in response to the n last negative pulses and the N positive pulses of the phase-encoding gradient.

49. The apparatus according to claim 48 comprising:
means for acquiring after the n+N electromagnetic signals in each sequence, a number of positive pulses of the phase-encoding gradient equal to P - (n+m+N) is applied.

50. The apparatus according to claim 48 comprising:
- means for performing a first series of sequences in correspondence with a selection of a first slice in the part of the object to be imaged;
- means for performing a second series of sequences in correspondence with a selection of a second slice in the part of the object to be imaged; and
- means for interlacing the sequences of the first series with the sequences of the second series.

51. The apparatus according to claim 50 comprising:
- means for acquiring four series of sequences in correspondence with selections of four slices in the part of the object to be imaged, that are preferably contiguous; and
- means for providing a state of mutual interlacing the sequences of all the series.

52. The apparatus according to claim 48 comprising:
- means for causing the durations of the n+m echoes to correspond to different values of an effective echo time corresponding to the spin-spin relaxation constant of atoms of the object to be imaged; and
- means for causing from one sequence to another, the durations of the n+m echoes develop from a low value to a high value of this echo time or vice versa.

53. The apparatus according to claim 52 wherein the low value is equal to about 30 milliseconds and the high value is equal to about 90 milliseconds.

54. The apparatus according to claim 48 comprising:
means for performing the sequences during a same holding of the breath of a patient whose body is being examined.

55. The apparatus according to claim 48 wherein:
- the part of the object examined is a patient's heart;
- means for synchronizing all the sequences with a heartbeat of the patient; and
- the patient is brought to hold his breath for the totalized duration of all the sequences of the series of sequences.

56. The apparatus according to claim 55 wherein the holding of the patient's breath is preceded by a set of sequences of P electromagnetic RF excitations.

57. A computer program product comprising a computer useable medium having computer readable program code means embodied in the medium, the computer readable program code. means implementing the method according to claim 1.

58. An article of manufacture for use with a computer system, the article of manufacture comprising a computer readable medium having computer readable program code means embodied in the medium, the program code means implementing of the method according to claim 1.

59. A program storage device readable by a machine tangibly embodying a program of instructions executable by the machine to perform the method according to claim 1.

60. The apparatus according to claim 48 wherein N is greater than n.

* * * * *